United States Patent
Kim

(10) Patent No.: US 9,209,228 B2
(45) Date of Patent: Dec. 8, 2015

(54) ORGANIC LIGHT EMITTING DIODE DISPLAY AND MANUFACTURING METHOD THEREOF

(71) Applicant: Samsung Display Co., Ltd., Yongin, Gyeonggi-do (KR)

(72) Inventor: Jun-Young Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 14/149,794

(22) Filed: Jan. 7, 2014

(65) Prior Publication Data
US 2014/0191219 A1   Jul. 10, 2014

(30) Foreign Application Priority Data
Jan. 9, 2013   (KR) .......................... 10-2013-0002544

(51) Int. Cl.
*H01L 27/32*   (2006.01)

(52) U.S. Cl.
CPC ........ *H01L 27/3206* (2013.01); *H01L 27/3283* (2013.01)

(58) Field of Classification Search
CPC .................................................. H01L 27/3206
USPC ............................................................ 257/89
See application file for complete search history.

(56) References Cited

U.S. PATENT DOCUMENTS

2006/0208630 A1* 9/2006 Roman et al. ................. 313/503
2010/0015424 A1* 1/2010 Seo et al. ...................... 428/216

FOREIGN PATENT DOCUMENTS

| KR | 10-2005-0049688 A | 5/2005 |
| KR | 10-2007-0028122 A | 3/2007 |
| KR | 10-2007-0106240 A | 11/2007 |
| KR | 10-2009-0028512 A | 3/2009 |
| KR | 10-2011-0081522 A | 7/2011 |
| KR | 10-2012-0042521 A | 5/2012 |

* cited by examiner

*Primary Examiner* — Mohammad Choudhry
(74) *Attorney, Agent, or Firm* — Christie, Parker & Hale, LLP

(57) ABSTRACT

An organic light emitting diode (OLED) display includes: pixel electrodes formed on a substrate; a pixel definition layer between the pixel electrodes and partitioning a pixel area; organic emission layers of a plurality of colors on the pixel electrodes; and a common electrode on the organic emission layers. The pixel definition layer includes a first pattern and a second pattern having different formation materials, thicknesses, and extension directions.

15 Claims, 11 Drawing Sheets

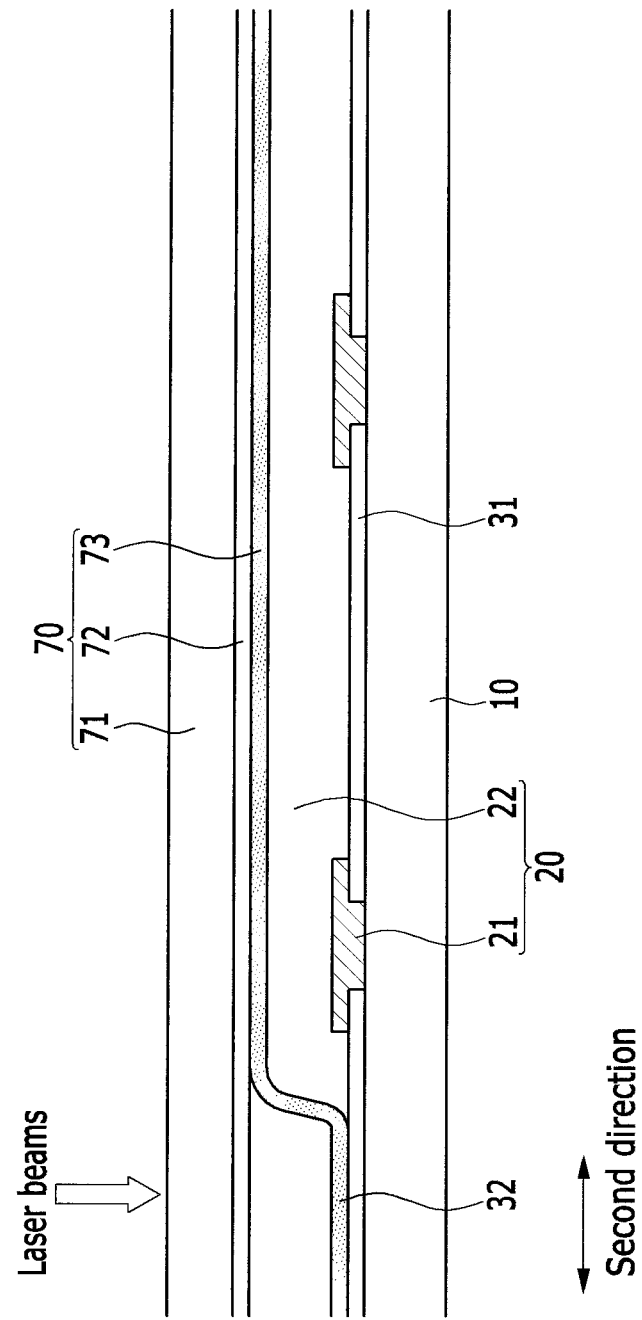

ORGANIC LIGHT EMITTING DIODE DISPLAY AND MANUFACTURING METHOD THEREOF

CROSS-REFERENCE TO RELATED PATENT APPLICATIONS

This application claims priority to and the benefit of Korean Patent Application No. 10-2013-0002544, filed in the Korean Intellectual Property Office on Jan. 9, 2013, the entire content of which is incorporated herein by reference.

BACKGROUND

1. Field

Embodiments of the present invention relate to an organic light emitting diode (OLED) display including a pixel definition layer, and a manufacturing method thereof.

2. Description of the Related Art

An organic light emitting diode display includes a plurality of pixels, and an organic light emitting diode (OLED) is included in each pixel. Each pixel is surrounded by a pixel definition layer and is distinguished (or separated) from neighboring pixels. The OLED includes a pixel electrode for each pixel, an organic emission layer on the pixel electrode, and a common electrode on a substrate.

The organic emission layer may include a red organic emission layer, a green organic emission layer, and a blue organic emission layer. In general, organic emission layers of different colors are arranged in a first direction, and organic emission layers of a same color are arranged in a second direction crossing the first direction. The pixel definition layer may be formed to have a lattice shape, and may be formed with an organic layer, such as a polyimide.

The organic emission layer may be formed by using a laser induced thermal imaging method. The laser induced thermal imaging method includes providing a base film and a donor film including a light-to-heat conversion layer and a transfer layer, and irradiating laser beams to the donor film to partially expand the light-to-heat conversion layer and expand the adjacent transfer layer thereby transferring the transfer layer onto a substrate. The laser induced thermal imaging method easily forms high-resolution patterns.

There is a limit to reducing the thickness of the pixel definition layer formed with an organic layer due to material or process characteristics, and the pixel definition layer may not have uniformity of height. Also, when the donor film is disposed on the substrate on which the pixel definition layer is formed and an organic emission layer with a specific color is transferred by continuously irradiating laser beams in a second direction, the organic emission layer generates a large curve near a part of the pixel definition layer (which is placed depending on the first direction), thereby deteriorating transfer quality.

The above information disclosed in this Background section is only for enhancement of understanding of the background of the described technology and, therefore, it may contain information that does not form the prior art that is already known in this country to a person of ordinary skill in the art.

SUMMARY

Embodiments of the present invention provide an organic light emitting diode (OLED) display directed toward increasing transfer quality of an organic emission layer by minimizing protrusions and depressions at a bottom of the organic emission layer due to transfer direction when the organic emission layer is formed according to a laser induced thermal imaging method, and a manufacturing method thereof.

An exemplary embodiment provides an organic light emitting diode display including: a plurality of pixel electrodes on a substrate; a pixel definition layer between the pixel electrodes and partitioning a pixel area; a plurality of organic emission layers of a plurality of colors on the pixel electrodes; and a common electrode on the organic emission layers. Here, adjacent ones of the organic emission layers in a first direction have different colors, adjacent ones of the organic emission layers in a second direction have a same color, and the pixel definition layer includes a first pattern in the first direction, and a second pattern in the second direction that is thicker than the first pattern.

The first pattern may include an inorganic layer, and the second pattern may include an organic layer.

The first pattern may include one of silicon oxide or silicon nitride, and the second pattern may include a polyimide:

The first pattern may be from about 1000 Å to about 3000 Å thick, and the second pattern may be from about 3000 Å to about 5000 Å thick.

One of the first pattern or the second pattern may be formed before the other one of the first pattern or the second pattern, and the first pattern and the second pattern may overlap at a crossing portion thereof.

An organic emission layer of one color from among the organic emission layers of the plurality of colors may be formed by laser induced thermal imaging.

The organic emission layer of one color may cover the first pattern and may extend in the second direction.

According to an embodiment of the present invention, an organic light emitting diode display includes: a plurality of pixel electrodes on a substrate; a pixel definition layer between the pixel electrodes and partitioning a pixel area; a plurality of organic emission layers of a plurality of colors on the pixel electrodes; and a common electrode on the organic emission layers. Here, the pixel definition layer includes a first pattern and a second pattern, the first pattern and the second pattern including different formation materials, having different thicknesses, and extending in different directions from each other.

Adjacent ones of the organic emission layers in a first direction may have different colors, and adjacent ones of the organic emission layers in a second direction may have a same color.

The first pattern may include an inorganic layer and may extend in the first direction, and the second pattern may include an organic layer, may be thicker than the first pattern, and may extend in the second direction.

An organic emission layer of one color from among the organic emission layers of the plurality of colors may be formed by laser induced thermal imaging, and the organic emission layer of the one color may cover the first pattern and may be arranged in the second direction.

According to an embodiment of the present invention, a method for manufacturing an organic light emitting diode display includes: forming a plurality of pixel electrodes on a substrate; forming a pixel definition layer between the pixel electrodes, the pixel definition layer including a first pattern and a second pattern, the first pattern and the second pattern including different formation materials, having different thicknesses, and extending in different directions from each other; disposing a base film and a donor film including a light-to-heat conversion layer and a transfer layer at a top of the substrate on which the pixel definition layer is formed; irradiating the donor film with a laser to transfer the transfer layer onto the pixel electrodes and to form an organic emission layer; and forming a common electrode on the organic emission layer.

The first pattern may be formed in a direction crossing an irradiation direction, and the second pattern may be formed thicker than the first pattern and may be formed in parallel with the irradiation direction.

The first pattern may be formed with an inorganic material, and the second pattern may be formed with an organic material.

The organic emission layer may be formed to cover the first pattern and may be formed in parallel with the irradiation direction.

BRIEF DESCRIPTION OF THE DRAWINGS

FIG. 9A to FIG. 9C show partial cross-sectional views of an organic light emitting diode (OLED) display for describing a third stage shown in FIG. 8.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Herein, unless explicitly described to the contrary, the word "comprise" or "include" and variations such as "comprises", "includes", "comprising", or "including" will be understood to imply the inclusion of stated elements but not the exclusion of any other elements. When it is said that any element, such as a layer, film, region, or electrode, is positioned on another element, the element may be directly on the other element or one or more intermediate elements may be interposed therebetween. In addition, an upper part of a target portion indicates an upper part or a lower part of the target portion, and it does not mean that the target portion is always positioned at the upper side based on a gravity direction.

Figure 1:
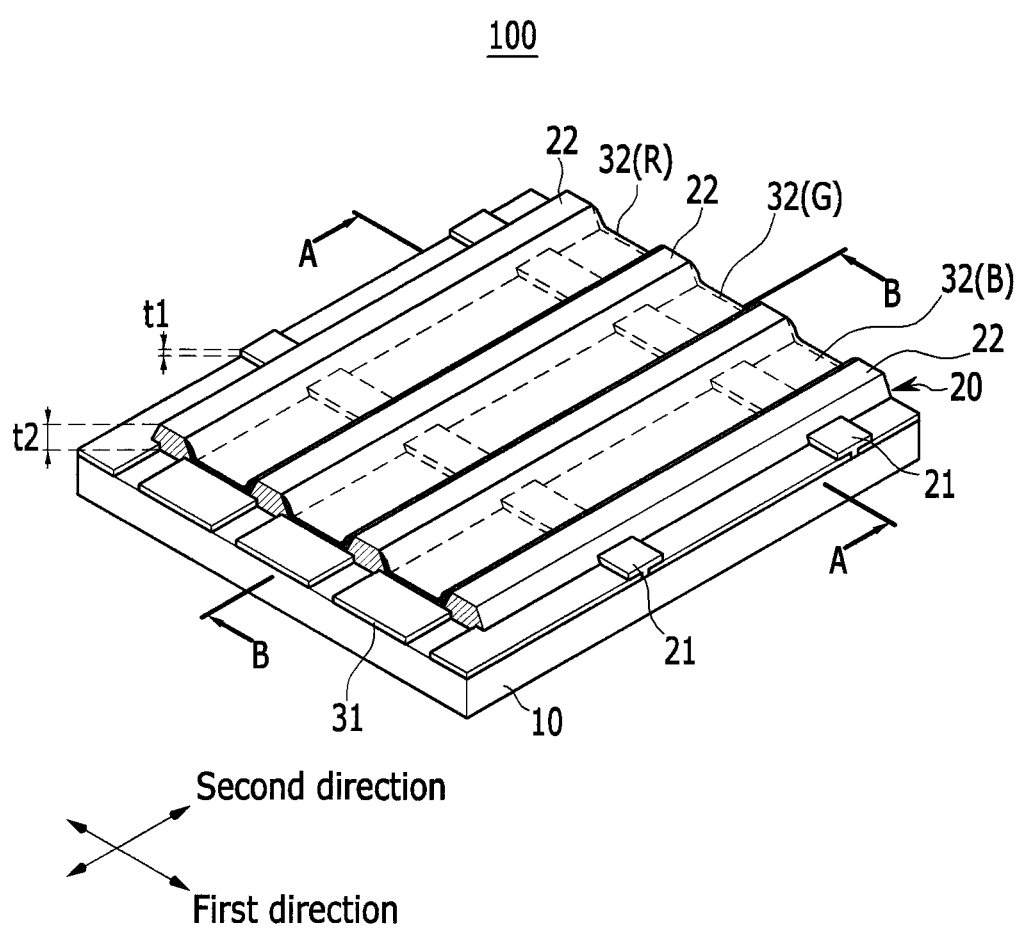
FIG. 1 shows a perspective view of an organic light emitting diode (OLED) display according to an exemplary embodiment.
Figure 2:
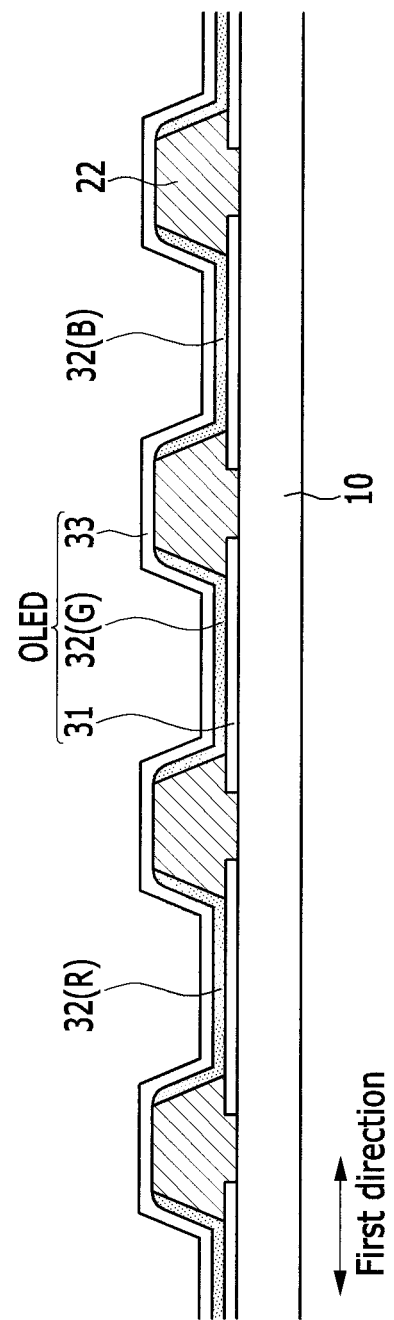
FIG. 2 shows a cross-sectional view of an organic light emitting diode (OLED) display with respect to the line A-A of FIG. 1.
Figure 3:
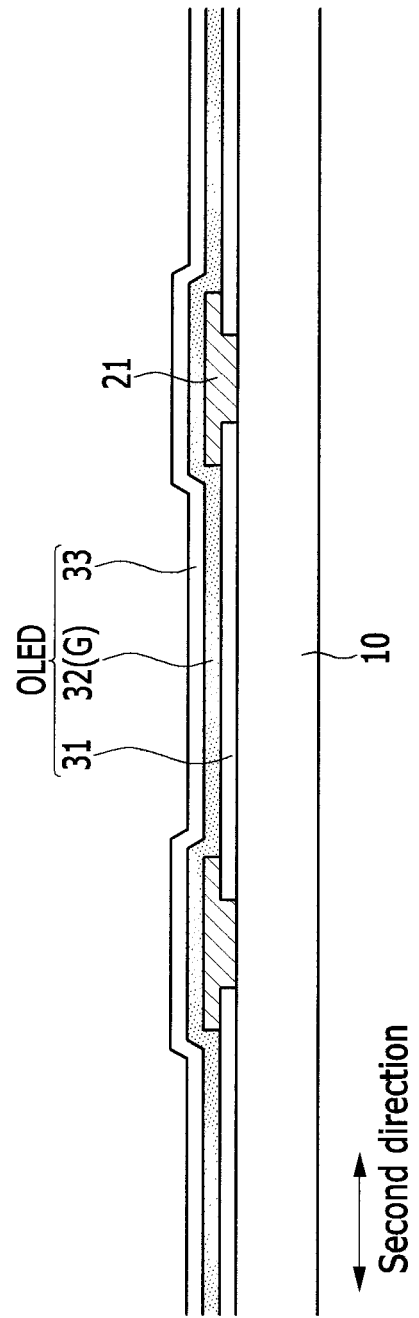
FIG. 3 shows a cross-sectional view of an organic light emitting diode (OLED) display with respect to the line B-B of FIG. 1.

FIG. 1 shows a perspective view of an organic light emitting diode (OLED) display according to an exemplary embodiment, and FIG. 2 and FIG. 3 show cross-sectional views of an organic light emitting diode (OLED) display with respect to the line A-A and the line B-B of FIG. 1, respectively.

Referring to FIG. 1 to FIG. 3, the organic light emitting diode (OLED) display 100 includes a substrate 10, a pixel definition layer 20 on the substrate 10, and a plurality of organic light emitting diodes (OLED). The pixel definition layer 20 includes a first pattern 21 and a second pattern 22, which, according to one or more embodiments have different materials, heights, and/or directions of extension.

The substrate 10 may be made of glass, a polymer film, or a metal. A pixel circuit and an organic light emitting diode (OLED) are provided in each pixel area on the substrate 10. The pixel circuit includes at least two thin film transistors (e.g., a switching thin film transistor and a driving thin film transistor) and at least one capacitor.

The organic light emitting diode (OLED) includes a pixel electrode 31, an organic emission layer 32, and a common electrode 33. The pixel electrode 31 may be formed for each pixel and is electrically connected to the driving thin film transistor of the corresponding pixel. The common electrode 33 may be formed over the entire substrate 10 without distinguishing among pixels, and may be connected to a power source (ELVSS). For convenience, the common electrode 33 is not shown in FIG. 1.

The switching thin film transistor is used as a switch for selecting a pixel to emit light, and the driving thin film transistor applies driving power to the pixel electrode 31 of the selected pixel for emitting light from an organic emission layer 32.

One of the pixel electrode 31 and the common electrode 33 is an anode and the other is a cathode. Holes injected from the anode and electrons injected from the cathode are combined in the organic emission layer 32 to generate excitons, and the excitons output energy to emit light.

When the pixel electrode 31 is formed with a transparent conductive layer and the common electrode 33 is formed with a metal film, light of the organic emission layer 32 is reflected at the common electrode 33, is transmitted through the pixel electrode 31 and the substrate 10, and is discharged to the outside (i.e., a rear light emitting type). In comparison, when the pixel electrode 31 is formed with a metal film and the common electrode 33 is formed with a transparent conductive layer, light of the organic emission layer 32 is reflected at the pixel electrode 31, is transmitted through the common electrode 33, and is discharged to the outside (i.e., a front light emitting type).

The transparent conductive layer may be formed with indium tin oxide (ITO), indium zinc oxide (IZO), zinc oxide (ZnO), or indium oxide ($In_2O_3$). The metal film may be formed with at least one of magnesium (Mg), silver (Ag), gold (Au), calcium (Ca), lithium (Li), chromium (Cr), and aluminum (Al), or their alloys.

For convenience, the pixel circuit is omitted in FIG. 1 to FIG. 3, and a configuration of the pixel will be described later.

Each pixel is surrounded by the pixel definition layer 20 and is differentiated from neighboring pixels. That is, the pixel definition layer 20 forms openings for exposing a part of the pixel electrode 31 and is provided between the pixel electrodes 31 to partition the pixel area.

According to one embodiment, the pixel definition layer 20 includes a plurality of first patterns 21, which have a first thickness (t1, refer to FIG. 1) and are provided in a first direction. Here, at least a portion of the first patterns 21 are between the pixel electrodes 31. In the present embodiment, the pixel definition layer 20 further includes a plurality of second patterns 22, which have a second thickness (t2, refer to FIG. 1) that is greater than the first thickness t1 and are provided in a second direction. Here, at least a portion of the second patterns 22 are between the pixel electrodes 31. The first direction crosses the second direction.

The first pattern 21 may be formed with an inorganic layer such as a silicon oxide ($SiO_2$) film or a silicon nitride (SiNx) film. The first pattern 21 may be formed by depositing an inorganic layer on the substrate 10 on which the pixel electrodes 31 are formed and patterning the same according to a photolithography process.

The second pattern 22 may be formed with an organic layer such as a polyimide. The second pattern 22 may be formed on the substrate 10 on which the pixel electrodes 31 and the first patterns 21 are formed according to a gravure printing method, or may be formed by coating an organic layer on the substrate and patterning the same according to a photolithography process.

The first pattern 21 may be formed on the substrate 10 in advance of the second pattern 22. In this instance, the second pattern 22 covers the first pattern 21 where it crosses (or overlaps) the first pattern 21.

According to one embodiment, an organic emission layer 32 is provided on the pixel electrodes 31 and the pixel definition layer 20.

The organic emission layer 32 may include a red organic emission layer 32(R), a green organic emission layer 32(G), and a blue organic emission layer 32(B). The organic emission layers 32(R), 32(G), and 32(B) may be alternately and repeatedly provided in the first direction, and the organic emission layers 32 of the same color may be provided in the second direction. The organic emission layer 32 may be formed in a line pattern in the second direction, or it may be formed for each pixel electrode 31.

Figure 4:
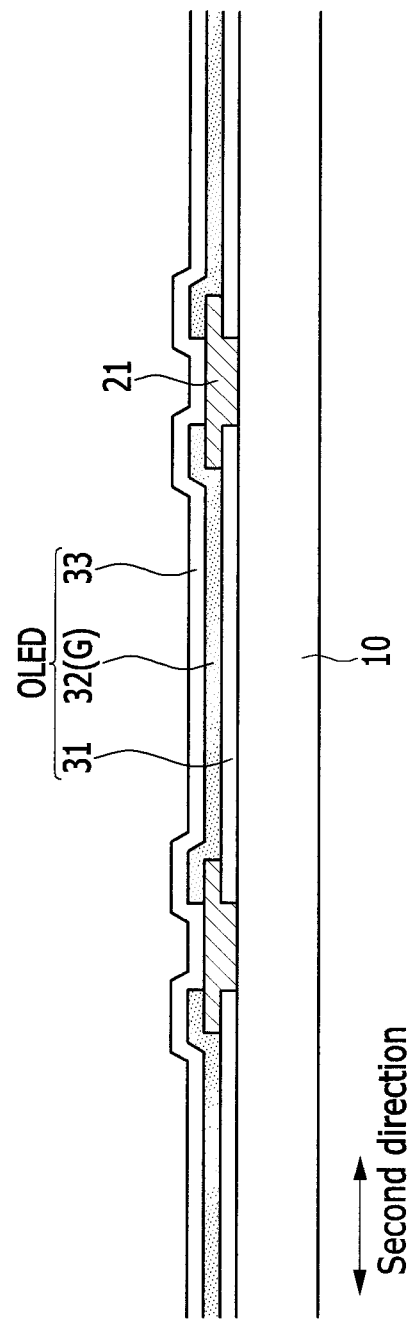
FIG. 4 shows a cross-sectional view of a first exemplary variation of an organic light emitting diode (OLED) display shown in FIG. 1.

For example, the organic emission layer 32 may be formed with a line pattern over a plurality of pixel electrodes 31 between two neighboring second patterns 22, or it may be formed individually for each pixel electrode 31. FIG. 1 shows the first case and FIG. 4 shows the second case. In FIG. 4, the organic emission layer 32 and the top of the pixel electrode 31 partially overlap on the side and the top of the first pattern 21.

In one embodiment, at least one of the red, green, and blue organic emission layers 32(R), 32(G), and 32(B) is formed by using a laser induced thermal imaging method. For example, the three organic emission layers 32(R), 32(G), and 32(B) may be formed by using the laser induced thermal imaging method, or one of the organic emission layers 32 may be formed by using a metal mask based deposition method and the other two organic emission layers 32 may be formed by using the laser induced thermal imaging method.

The method, according to one embodiment, for forming the organic emission layer 32 by using the laser induced thermal imaging method includes: providing a base film and a donor film including a light-to-heat conversion layer and a transfer layer; disposing the donor film on a top of a substrate 10 on which a pixel definition layer 20 is formed; and irradiating laser beams to the donor film to partially expand the light-to-heat conversion layer, expand the neighboring transfer layer, and transfer the transfer layer to the top of the substrate 10.

During the above process, the transfer layer is transferred to the top of the organic emission layer 32 in a laser beam scan direction. According to one embodiment, the laser beam scan direction is a second direction that is a disposition direction of the same-color organic emission layers 32. A detailed method for forming an organic emission layer 32 using the laser induced thermal imaging method will be described later when a method for manufacturing an organic light emitting diode (OLED) display is described.

In the organic light emitting diode (OLED) display 100, the pixel definition layer 20 is not formed to have a constant height. The pixel definition layer 20 may be formed to have a low height at a portion where it overlaps the organic emission layer 32 in the laser beam scan direction, which is a disposition direction of the same-color organic emission layers 32. For example, a height of the first pattern 21 overlapping the organic emission layer 32 in the laser beam scan direction may be less than a height of the second pattern 22 crossing the first pattern 21.

Therefore, the organic light emitting diode (OLED) display 100 reduces (or minimizes) bottom protrusions and/or depressions of the organic emission layer 32 in the transfer direction to reduce a curve of the organic emission layer 32 and thereby improve pattern quality of the organic emission layer 32. Also, when the light-to-heat conversion layer and the transfer layer are expanded in the transfer direction, a sufficient expansion space is provided between the two neighboring second patterns 22 to increase transfer quality of the organic emission layer 32.

In this instance, the first pattern 21 formed with an inorganic layer may be deposited to be as thin as desired, which may differ from the second pattern 22 formed with an organic layer. A thickness (e.g., a first thickness t1) of the first pattern 21 may be from about 1000 Å to about 3000 Å. When the first pattern 21 is less than about 1000 Å thick, uniformity of thickness may be reduced, and when the same is greater than about 3000 Å, processing time for forming the first pattern 21 may be unsatisfactorily increased.

A thickness (e.g., a second thickness t2) of the second pattern 22 may be about 3000 Å to about 5000 Å. When the second pattern 22 is less than about 3000 Å thick, a partial pattern may be lost and the uniformity of thickness may be reduced. When the second pattern 22 is greater than about 5000 Å thick, energy for transferring the transfer layer may be unsatisfactorily increased and the laser induced thermal imaging may not be appropriately performed.

The case in which the first pattern 21 is formed on the substrate 10 in advance of the second pattern 22 has been described; however, other embodiments are included within the scope of the present invention. For example, FIG. 5 illustrates an OLED display 100' according to one embodiment that includes a second pattern 22 of a pixel definition layer 20 formed on a substrate 10 in advance of a first pattern 21'.

Figure 5:
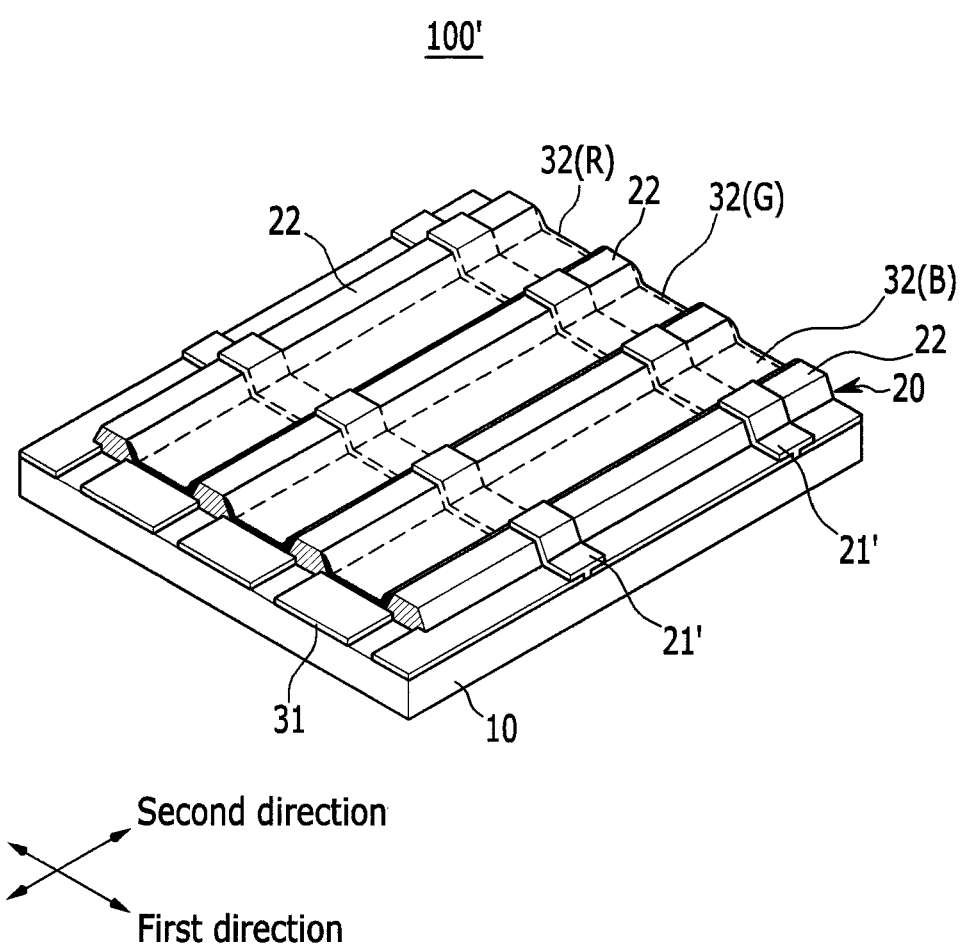
FIG. 5 shows a perspective view of a second exemplary variation of an organic light emitting diode (OLED) display shown in FIG. 1.

As shown in FIG. 5, the first pattern 21' touches (or is on) both sides and a top of the second pattern 22, and covers the second pattern 22 at a portion in which the first pattern 21' crosses the second pattern 22. A process order of the first pattern 21' and the second pattern 22 is determined by a film state below the pixel definition layer 20.

In the organic light emitting diode (OLED) display 100, the organic emission layer 32 may be formed with multilayers including at least one of a hole injection layer (HIL), a hole transport layer (HTL), an emission layer, an electron transport layer (ETL), and an electron injection layer (EIL). The emission layer may be formed according to the laser induced thermal imaging method, and other layers may be formed over the substrate 10. When the organic emission layer 32 includes the above layers, the hole injection layer (HIL) contacts the anode and the electron injection layer (EIL) contacts the cathode.

Figure 6:
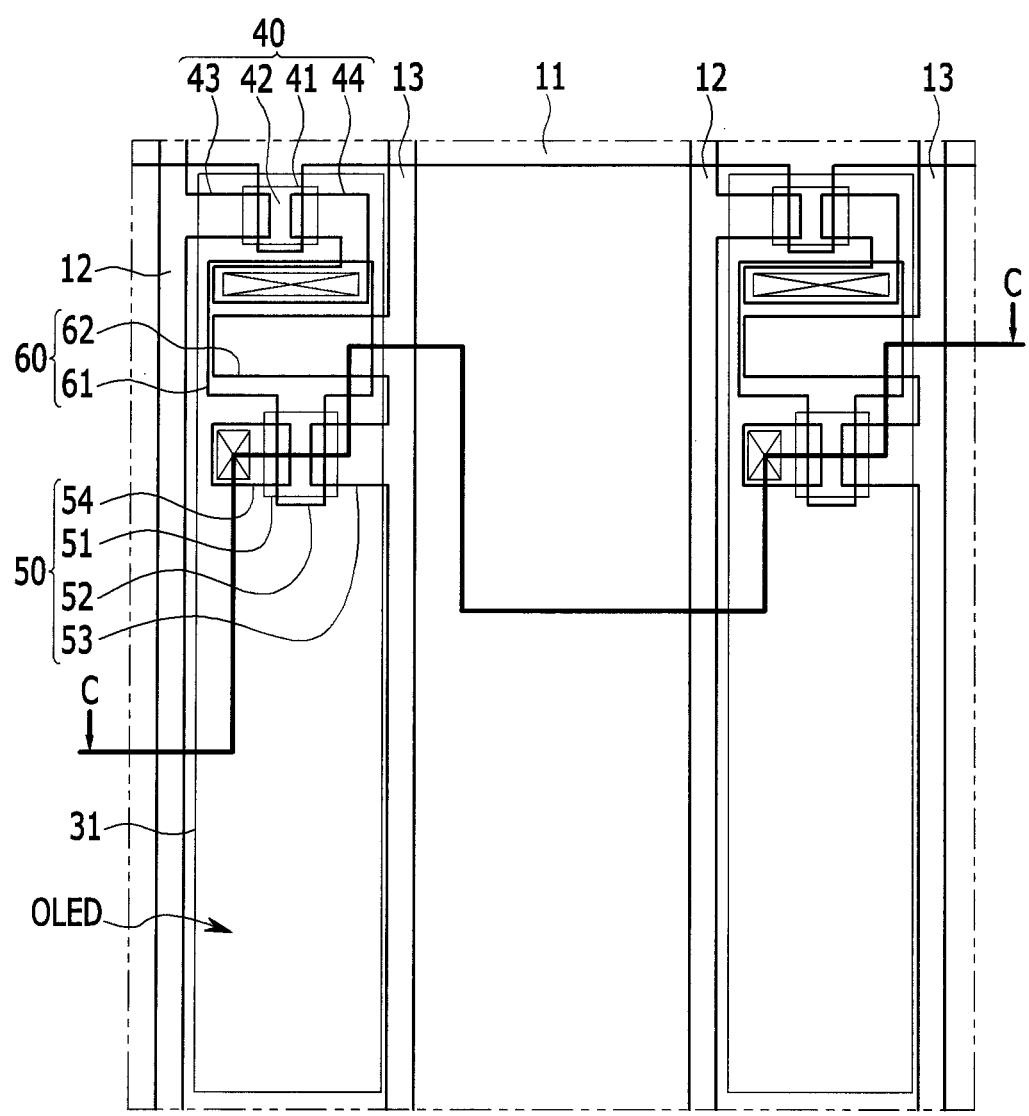
FIG. 6 shows a layout view of a pixel configuration of an organic light emitting diode (OLED) display shown in FIG. 1.
Figure 7:
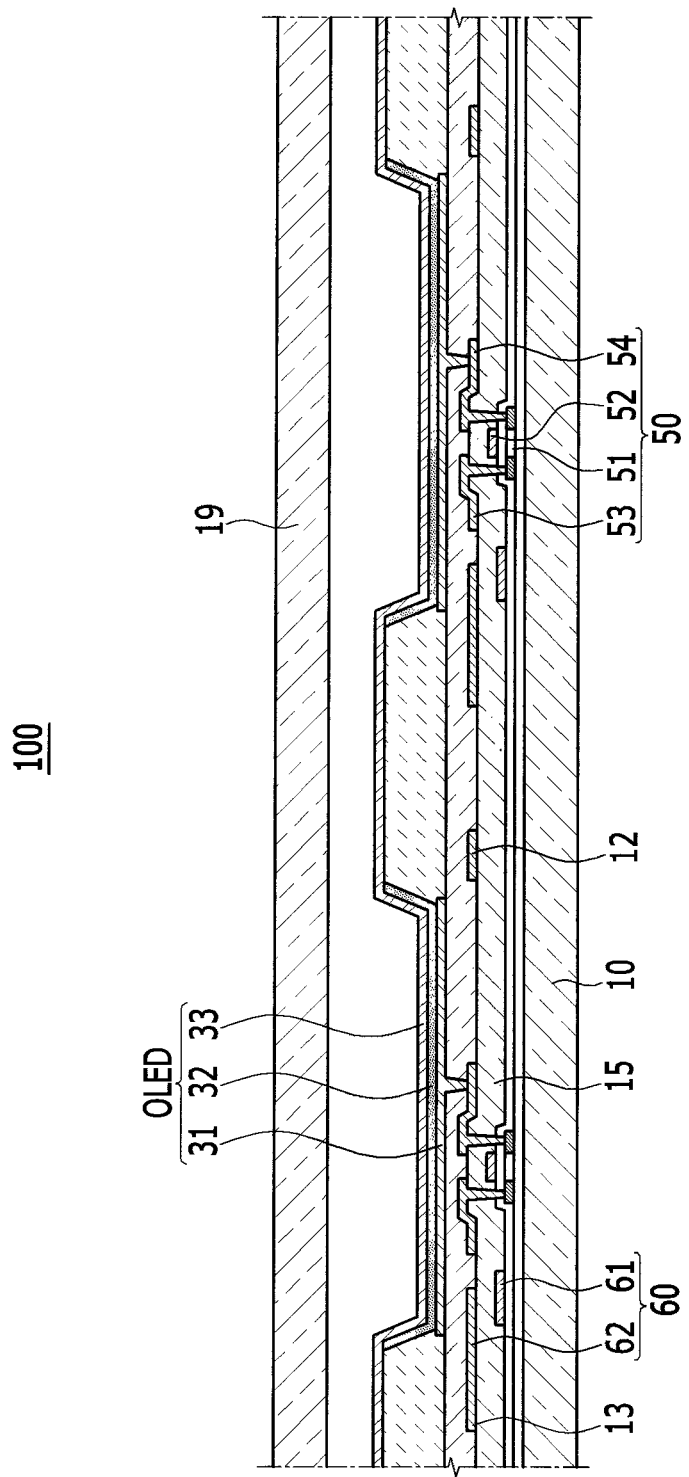
FIG. 7 shows a cross-sectional view of an organic light emitting diode (OLED) display with respect to the line C-C of FIG. 6.

FIG. 6 shows a layout view of an embodiment of a pixel configuration for an organic light emitting diode (OLED) display shown in FIG. 1, and FIG. 7 shows a cross-sectional view of the organic light emitting diode (OLED) display of FIG. 6 taken along the line C-C. The organic light emitting diode (OLED) display 100 is not restricted to the pixel configuration to be described, and an organic light emitting diode (OLED) display with another pixel configuration is also possible.

Referring to FIG. 6 and FIG. 7, the pixel circuit includes a switching thin film transistor 40, a driving thin film transistor 50, and a capacitor 60. The organic light emitting diode (OLED) display 100 includes a gate line 11 disposed in one direction, and a data line 12 and a common power supply line 13 crossing the gate line 11 in an insulated manner.

One pixel may be defined by a boundary of the gate line 11, the data line 12, and the common power supply line 13, but embodiments are not restricted thereto. Also, FIG. 6 shows the case in which two thin film transistors 40 and 50 and one capacitor 60 are provided for one pixel, however more transistors and or capacitors may be provided. For example, at least three thin film transistors and at least two capacitors may be provided for one pixel, and it is possible to form various configurations by adding other wires.

The capacitor 60 includes a pair of capacitor electrodes 61 and 62 disposed with an interlayer insulating layer 15 made of a dielectric material therebetween. Capacitance is determined according to a voltage between charges stored in the capacitor 60 and the two capacitor electrodes 61 and 62.

The switching thin film transistor 40 includes a switching semiconductor layer 41, a switching gate electrode 42, a switching source electrode 43, and a switching drain electrode 44. The driving thin film transistor 50 includes a driving semiconductor layer 51, a driving gate electrode 52, a driving source electrode 53, and a driving drain electrode 54.

The switching gate electrode 42 may be connected to the gate line 11. The switching source electrode 43 may be connected to the data line 12, and the switching drain electrode 44 may be connected to one capacitor electrode 61. The driving gate electrode 52 may be connected to the capacitor electrode 62 connected to the switching drain electrode 44. The driving source electrode 53 and another capacitor electrode 62 may be connected to the common power supply line 13. The driving drain electrode 54 may be connected to the pixel electrode 31 of the organic light emitting diode (OLED) through a contact hole.

In the present embodiment, the switching thin film transistor 40 is operated by a gate voltage applied to the gate line 11 to transmit a data voltage applied to the data line 12 to the driving thin film transistor 50. A voltage that corresponds to a difference between a common voltage applied to the driving thin film transistor 50 from the common power supply line 13 and the data voltage transmitted from the switching thin film transistor 40 is stored in the capacitor 60. A current corresponding to the voltage stored in the capacitor 60 flows to the organic light emitting diode (OLED) through the driving thin film transistor 50 to emit light from the organic emission layer 32.

An encapsulation substrate 19 made of glass or a polymer film may be integrally fixed to the substrate 10 by a sealant (not shown) coated to the edge thereof. The encapsulation substrate 19 seals the organic light emitting diode (OLED) from the external environment including moisture and oxygen to control deterioration of the organic light emitting diode (OLED) caused by moisture and oxygen.

A thin-film encapsulation layer (not shown) may be formed on the common electrode 33 instead of (or in addition to) the encapsulation substrate 19. The thin-film encapsulation layer may be configured such that at least one organic layer and at least one inorganic layer are alternately stacked.

The organic layer of the thin-film encapsulation layer is made of a polymer, and for example, it may be a single layer or a stacked layer formed with at least one of polyethylene terephthalate, polyimide, polycarbonate, epoxy, polyethylene, and polyacrylate. The inorganic layer of the thin-film encapsulation layer may be a single layer or a stacked layer including a metal oxide or a metal nitride. For example, the inorganic layer may include one of SiNx, $Al_2O_3$, $SiO_2$, and $TiO_2$.

The highest layer that is exposed to the outside from among the thin-film encapsulation layer may be formed with an inorganic layer in order to prevent permeation of moisture into the organic light emitting diode (OLED). The substrate 10 may be made of a polymer film and the organic light emitting diode (OLED) display 100 including the thin-film encapsulation layer may be flexible.

Figure 8:
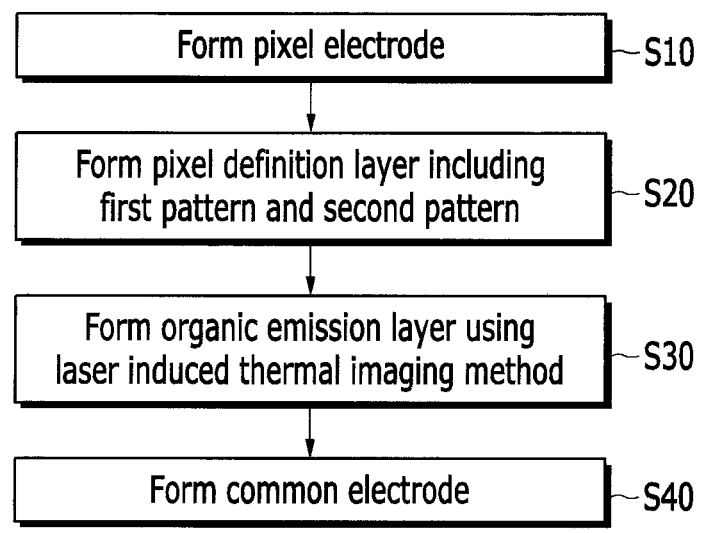
FIG. 8 shows a process flowchart of a method for manufacturing an organic light emitting diode (OLED) display according to an exemplary embodiment.

FIG. 8 shows a process flowchart of a method for manufacturing an organic light emitting diode (OLED) display according to an exemplary embodiment.

Referring to FIG. 8, the method for manufacturing an organic light emitting diode (OLED) display may include: forming a plurality of pixel electrodes (S10); forming a pixel definition layer including a first pattern and a second pattern (S20); forming an organic emission layer by using a laser induced thermal imaging method (S30); and forming a common electrode on the organic emission layer and the pixel definition layer (S40).

Referring to FIG. 1 and FIG. 5, in S10, the pixel electrode 31 is formed for each pixel and is electrically connected to the driving thin film transistor of the corresponding pixel. In S20, the pixel definition layer 20 includes a first pattern 21 formed in a first direction between the pixel electrodes 31, and a second pattern 22 formed in a second direction between the pixel electrodes 31.

The first pattern 21 may be made of an inorganic layer, such as a silicon oxide film or a silicon nitride film, and may be from about 1000 Å to about 3000 Å thick. The second pattern 22 may be made of an organic layer, such as a polyimide, and may be from about 3000 Å to about 5000 Å thick. The first pattern 21 may be formed prior to or later than the second pattern 22.

Figure 9A:
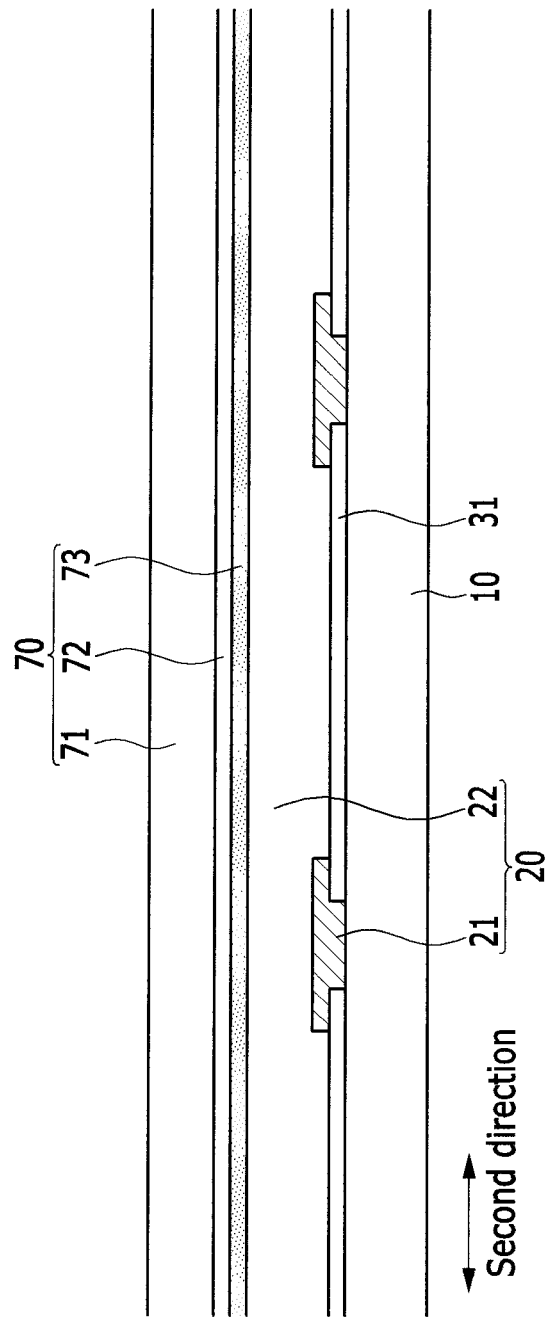
Figure 9C:
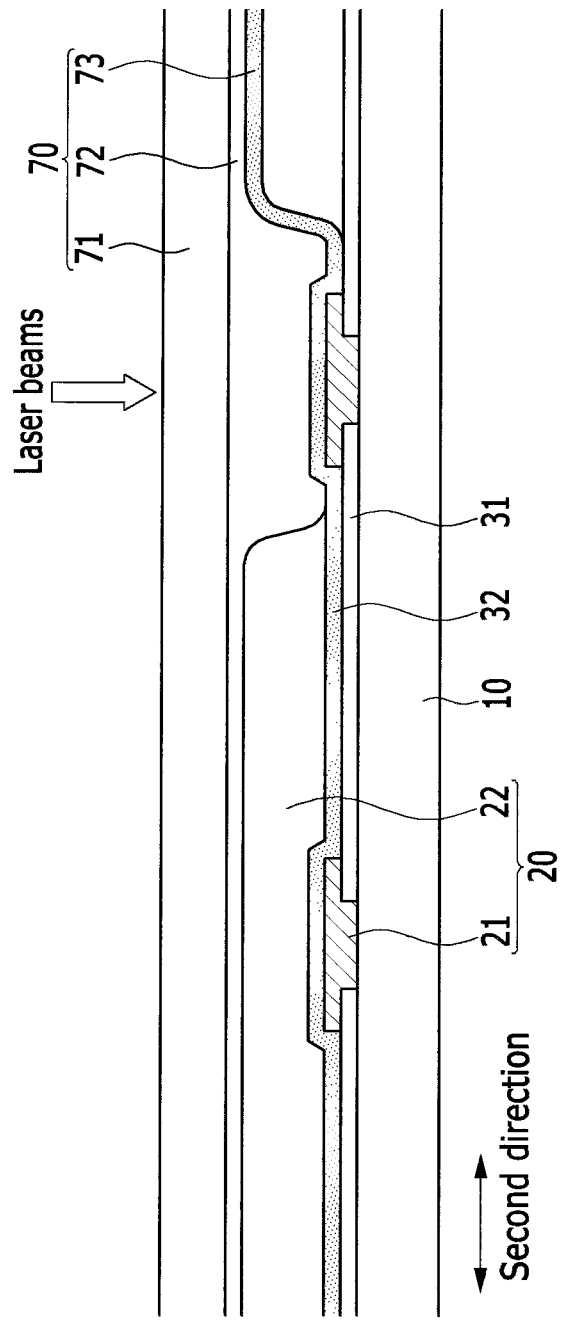

FIG. 9A to FIG. 9C show partial cross-sectional views of an organic light emitting diode (OLED) display for describing forming an organic emission layer by using a laser induced thermal imaging method (S30) as shown in FIG. 8.

Referring to FIG. 9A, a donor film 70 is provided on a top of the substrate 10 on which the pixel definition layer 20 is formed. The donor film 70 includes a base film 71, a light-to-heat conversion layer 72 on the base film 71, and a transfer layer 73 on the light-to-heat conversion layer 72. The donor film 70 is disposed so that the transfer layer 73 contacts (or is on) the pixel definition layer 20, and the transfer layer 73 is transferred above the pixel electrode 31 to form the organic emission layer 32.

The base film 71 functions as a support for the light-to-heat conversion layer 72 and the transfer layer 73. The base film 71 may be made of a polymer film with light transmittance that is greater than about 90%, such as polyester, polycarbonate, polyolefin, polyvinyl resin, or polyethylene terephthalate.

The light-to-heat conversion layer 72 provides transfer energy to the transfer layer 73, and may include a radiation absorber to transform light energy of laser beams into heat energy. The light-to-heat conversion layer 72 may be formed as a thin film by using a metal or a metal compound. An intermediate layer (not shown) may be provided between the light-to-heat conversion layer 72 and the transfer layer 73 to prevent a material of the light-to-heat conversion layer 72 from permeating into the transfer layer 73.

Referring to FIG. 9B and FIG. 9C, laser beams are irradiated on the donor film 70 in the second direction over the pixel electrodes 31. The light-to-heat conversion layer 72 at the portion to which the laser beams are irradiated from among the donor film 70 is expanded. The transfer layer 73 is accordingly expanded and separated from the donor film 70, and is irradiated on the pixel electrode 31 and the first pattern 21. By the above-noted method, the organic emission layer 32 of a single color is formed in the second direction.

During the process, because the first patterns 21 with less thickness are provided below the transfer layer 73 in the transfer direction (e.g., the second direction), a large expansion space of the light-to-heat conversion layer 72 and the transfer layer 73 is acquired to increase transfer quality of the organic emission layer 32. Also, the bottom protrusions and depressions of the organic emission layer 32 caused by the transfer direction are minimized (or reduced) to reduce the curve of the organic emission layer 32 and to increase the pattern quality of the organic emission layer 32.

The organic emission layer 32 may be formed with multiple layers including, for example, at least one of a hole injection layer (HIL), a hole transport layer (HTL), an emission layer, an electron transport layer (ETL), and an electron injection layer (EIL). The emission layer may be formed by using the laser induced thermal imaging method. Although not shown in FIG. 9A to FIG. 9C, at least one of the hole injection layer (HIL), the hole transport layer (HTL), the electron transport layer (ETL), and the electron injection layer (EIL) may be formed throughout the substrate 10.

When the pixel electrode 31 is an anode, the hole injection layer (HIL) and the hole transport layer (HTL) are formed before the emission layer, and the electron transport layer (ETL) and the electron injection layer (EIL) are formed after the emission layer. By comparison, when the pixel electrode 31 is a cathode, the electron injection layer (EIL) and the electron transport layer (ETL) are formed before the emission layer, and the hole transport layer (HTL) and the hole injection layer (HIL) are formed after the emission layer.

Referring to FIG. 1 and FIG. 5, in S40, the common electrode 33 covers the organic emission layer 32 and the pixel definition layer 20, and is formed throughout the substrate 10.

According to the embodiments, protrusions and depressions at the bottom of the organic emission layer caused by the transfer direction are minimized (or reduced) to reduce the curve of the organic emission layer, thereby increasing pattern quality of the organic emission layer. Also, when the light-to-heat conversion layer and the transfer layer are expanded in the transfer direction, a sufficient expansion space is provided between two neighboring second patterns thereby increasing transfer quality of the organic emission layer.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light emitting diode display comprising:
    a plurality of pixel electrodes on a substrate;
    a pixel definition layer between the pixel electrodes and partitioning a pixel area;
    a plurality of organic emission layers of a plurality of colors on the pixel electrodes; and
    a common electrode on the organic emission layers,
    wherein adjacent ones of the organic emission layers in a first direction have different colors,
    wherein adjacent ones of the organic emission layers in a second direction have a same color, and
    wherein the pixel definition layer comprises a first pattern comprising a plurality of separate parallel lines extending in the first direction and comprising a first formation material, and a second pattern comprising a plurality of separate parallel lines extending in the second direction, the second pattern being thicker than the first pattern and comprising a second formation material different from the first formation material,
    wherein each of the separate parallel lines of the first pattern overlaps with each of the separate parallel lines of the second pattern.

2. The organic light emitting diode display of claim 1, wherein the first pattern comprises an inorganic layer, and wherein the second pattern comprises an organic layer.

3. The organic light emitting diode display of claim 2, wherein the first pattern comprises one of silicon oxide or silicon nitride, and wherein the second pattern comprises a polyimide.

4. The organic light emitting diode display of claim 2, wherein the first pattern is from about 1000 Å to about 3000 Å thick, and wherein the second pattern is from about 3000 Å to about 5000 Å thick.

5. The organic light emitting diode display of claim 2, wherein one of the first pattern or the second pattern is formed before the other one of the first pattern or the second pattern, and wherein the first pattern and the second pattern overlap at a crossing portion thereof.

6. The organic light emitting diode display of claim 1, wherein an organic emission layer of one color from among the organic emission layers of the plurality of colors is formed by laser induced thermal imaging.

7. The organic light emitting diode display of claim 6, wherein the organic emission layer of one color covers the first pattern and extends in the second direction.

8. An organic light emitting diode display comprising:
    a plurality of pixel electrodes on a substrate;
    a pixel definition layer between the pixel electrodes and partitioning a pixel area;
    a plurality of organic emission layers of a plurality of colors on the pixel electrodes; and
    a common electrode on the organic emission layers,
    wherein the pixel definition layer comprises a first pattern and a second pattern, the first pattern and the second pattern comprising different formation materials, having different thicknesses, and extending in different directions from each other,
    wherein the first pattern comprises a plurality of separate parallel lines and the second pattern comprises a plurality of separate parallel lines, and
    wherein each of the separate parallel lines of the first pattern overlaps with each of the separate parallel lines of the second pattern.

9. The organic light emitting diode display of claim 8, wherein adjacent ones of the organic emission layers in a first direction have different colors, and wherein adjacent ones of the organic emission layers in a second direction have a same color.

10. The organic light emitting diode display of claim 9, wherein the first pattern comprises an inorganic layer and extends in the first direction, and wherein the second pattern comprises an organic layer, is thicker than the first pattern, and extends in the second direction.

11. The organic light emitting diode display of claim 10, wherein an organic emission layer of one color from among the organic emission layers of the plurality of colors is formed by laser induced thermal imaging, and
wherein the organic emission layer of the one color covers the first pattern and is arranged in the second direction.

12. A method for manufacturing an organic light emitting diode display comprising:

forming a plurality of pixel electrodes on a substrate;

forming a pixel definition layer between the pixel electrodes, the pixel definition layer comprising a first pattern and a second pattern, the first pattern and the second pattern comprising different formation materials, having different thicknesses, and extending in different directions from each other;

disposing a base film and a donor film comprising a light-to-heat conversion layer and a transfer layer at a top of the substrate on which the pixel definition layer is formed;

irradiating the donor film with a laser to transfer the transfer layer onto the pixel electrodes and to form an organic emission layer; and forming a common electrode on the organic emission layer.

13. The method of claim 12, wherein the first pattern is formed in a direction crossing an irradiation direction, and wherein the second pattern is formed thicker than the first pattern and is formed in parallel with the irradiation direction.

14. The method of claim 13, wherein the first pattern is formed with an inorganic material, and wherein the second pattern is formed with an organic material.

15. The method of claim 13, wherein the organic emission layer is formed to cover the first pattern and is formed in parallel with the irradiation direction.

* * * * *